United States Patent
Fukuda et al.

(10) Patent No.: US 6,472,763 B2
(45) Date of Patent: Oct. 29, 2002

(54) SEMICONDUCTOR DEVICE WITH BUMPS FOR PADS

(75) Inventors: Tomoyuki Fukuda, Aizuwakamatsu (JP); Eiji Watanabe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/725,146

(22) Filed: Nov. 29, 2000

(65) Prior Publication Data

US 2002/0125569 A1 Sep. 12, 2002

(30) Foreign Application Priority Data

Jun. 6, 2000 (JP) .................................. 2000-169482

(51) Int. Cl.⁷ .............................................. H01L 23/48
(52) U.S. Cl. .................. 257/780; 257/779; 257/786; 257/775; 257/773; 257/772; 257/776
(58) Field of Search ................................ 257/773, 772, 257/780, 778, 775, 776, 779, 786

(56) References Cited

U.S. PATENT DOCUMENTS 5,946,590 A  *  8/1999  Satoh ......................... 438/613
6,030,512 A  *  2/2000  Ihara et al. ............. 204/224 R

* cited by examiner

Primary Examiner—David L. Talbott
Assistant Examiner—Luan T. Thai
(74) Attorney, Agent, or Firm—Armstrong, Westerman, Hattori, LLP

(57) ABSTRACT

A conductive electrode pad is formed on a partial area of an insulating surface. An insulating film covers the electrode pad. The insulating film has an opening exposing at least a partial upper surface of the electrode pad. A barrier layer of conductive material is formed on the partial upper surface exposed on the bottom of the opening and on the surface of the insulating film near the opening. A conductive bump is adhered to the barrier layer. A step is formed on the surface of a layer under the barrier layer between an outer periphery of the barrier layer and an outer periphery of the opening.

13 Claims, 7 Drawing Sheets

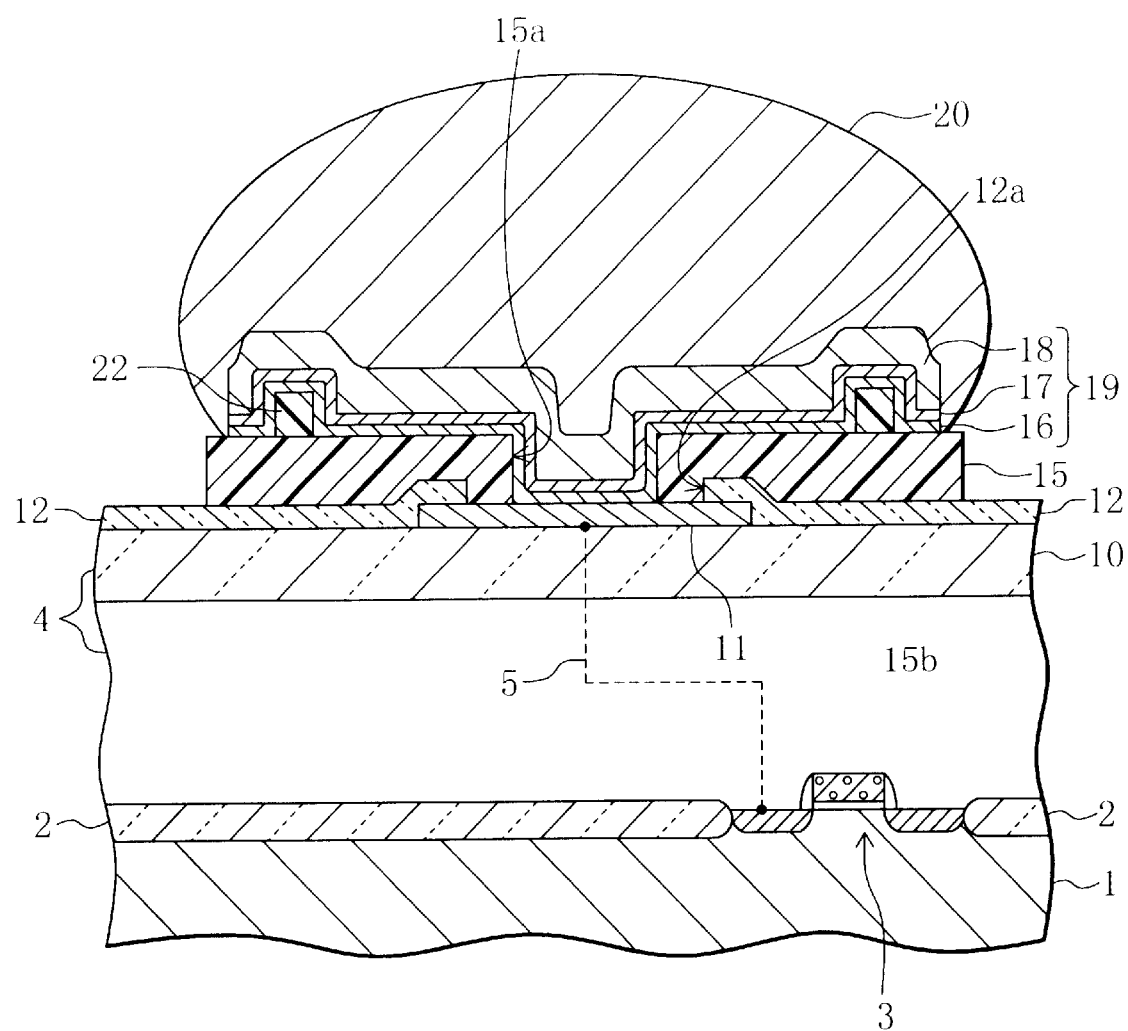

US 6,472,763 B2

SEMICONDUCTOR DEVICE WITH BUMPS FOR PADS

This application is based on Japanese Patent Application 2000-169482, filed on Jun. 6, 2000, the entire contents of which are incorporated herein by reference.

BACKGROUND OF THE INVENTION a) Field of the Invention

The present invention relates to a semiconductor device, and more particularly to a semiconductor device with bumps for pads.

b) Description of the Related Art

FIG. 6 is a cross sectional view showing a conventional semiconductor device having an electrode pad and a bump formed over the pad.

An interlayer insulating film 100 is formed on a semiconductor substrate. An electrode pad 101 is formed on a partial upper surface of the interlayer insulating film 100. A protective film 102 covers the surfaces of the electrode pad 101 and interlayer insulating film 100, the protective film 102 having a two-layer structure of a silicon nitride film and a silicon oxide film. An opening 102a is formed through the protective film 102 to expose a partial upper surface of the electrode pad 101.

An insulating film 103 of polyimide is formed on the electrode pad 101 and nearby protective film 102. An opening 103a is formed through the insulating film 103 to expose a partial upper surface of the electrode pad 101. The inner surface of the opening 103a and the upper surface of the insulating film 103 near the opening 103a are covered with a three-layer lamination of a Ti film 105, a Cu film 106 and a Ni film 107. A solder bump 108 is formed on the Ni film 107.

The Ti film 106 promotes adhesion to the Cu film 106. The Cu film 106 promotes adhesion to the Ni film 107. The Ni film 107 prevents constituent elements of the solder bump 108 from diffusing into the electrode pad 101.

The solder bump 108 covers not only the upper surface of the Ni film 107 but also the side wall of the lamination from the Cu film 106 to Ni film 107. Tin (Sn) atoms in the melted solder bump 108 diffuse into the Cu film 106 from its side wall. The region where the Sn atoms were diffused expands its volume so that the Cu film 106 is susceptible to peel-off.

If the Cu film 106 is peeled off, solder enters a gap formed at the interface between the Ti film 105 and Cu film 106. Sn atoms in the solder entered the gap further diffuse into the Cu film 106. Peel-off progresses still more inward. As the peel-off progresses, adhesion of the bump is degraded. If Sn atoms reach the electrode pad 101, the electric characteristics such as a wiring resistance are deteriorated.

SUMMARY OF THE INVENTION

It is an object of the present invention to provide a semiconductor device capable of suppressing adhesion reduction of a bump and an increase in resistance of a wiring connected to the bump.

According to one aspect of the present invention, there is provided a semiconductor device comprising: a conductive electrode pad formed on a partial area of an insulating surface; an insulating film covering the electrode pad, the insulating film having an opening exposing at least a partial upper surface of the electrode pad; a barrier layer of conductive material formed on the partial upper surface exposed on a bottom of the opening and on a surface of the insulating film near the opening; and a conductive bump adhered to the barrier layer, wherein a step is formed on a surface of a layer under the barrier layer between an outer periphery of the barrier layer and an outer periphery of the opening.

The step prevents a further progress of a gradual peel-off of the barrier layer from its outer periphery. It is therefore possible to suppress the peel-off of the barrier layer and improve adhesion of the bump.

BRIEF DESCRIPTION OF THE DRAWINGS

FIG. 5 is a cross sectional view of a semiconductor device according to a second embodiment of the invention.

DETAILED DESCRIPTION OF THE PREFERRED EMBODIMENTS

Figure 1:
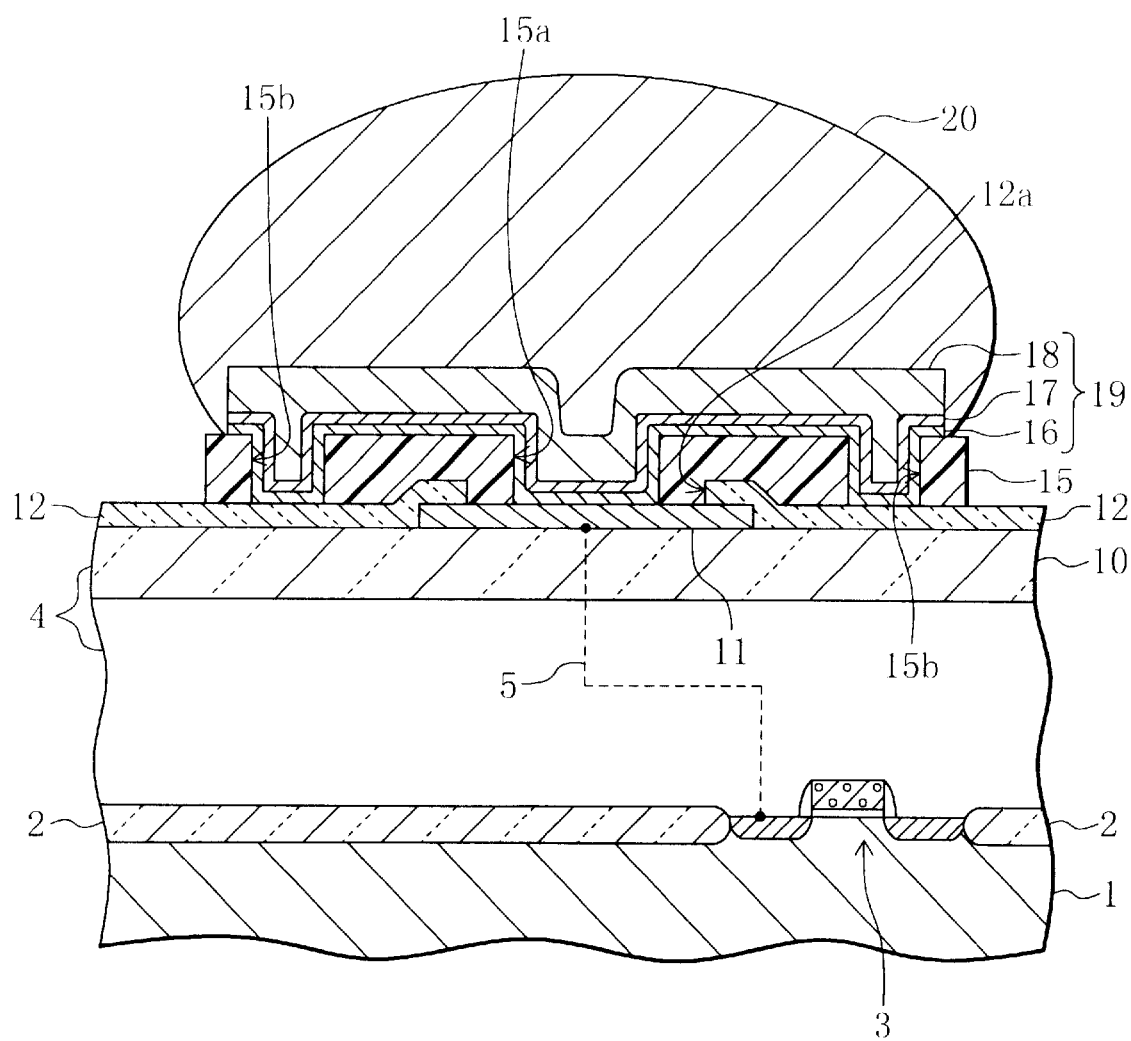
FIG. 1 is a cross sectional view of a semiconductor device according to a first embodiment of the invention.

FIG. 1 is a cross sectional view of a semiconductor device according to an embodiment of the invention. As shown in FIG. 1, on the surface of a silicon substrate 1, a field oxide film 2 is formed which defines an active region. In this active region, a MOSFET 3 is formed. A multi-layer wiring layer 4 is formed on the field oxide film 2. The multi-layer wiring layer has a lamination structure that an interlayer insulating film and a wiring layer are alternately stacked. Wiring patterns in different wiring layers are electrically connected together through via holes formed in interlayer insulating films.

An interlayer insulating film 10 is disposed at the highest layer of the multi-layer wiring layer 4. An electrode pad 11 of Cu is formed on a partial upper surface of the interlayer insulating film 10. The electrode pad 11 is electrically continuous with a wiring pattern formed on the surface of the interlayer insulating film 10, and electrically connected to the source or drain region of MOSFET 3 via a wiring 5 formed in the multi-layer wiring layer 4. The electrode pad 11 is connected in some cases to another electronic component formed on the surface of the silicon substrate 1.

A protective film 12 having a two-layer structure of a silicon nitride film and a silicon oxide film covers the surfaces of the interlayer insulating film 10 and electrode pad 11. An opening 12a is formed through the protective film 12 in an area corresponding to the electrode pad 11. A partial upper surface of the electrode pad 11 is exposed on the bottom of the opening 12a.

A 4 μm thick insulating film 15 of polyimide is formed on the inner surface of the opening 12a and on the surface of the protective film 12 near the opening 12a. An opening 15a is formed through the insulating film 15 in an area corresponding to the electrode pad 11. The opening 15a is located inside the operating 12a. The insulating film 15 has a groove 15b reaching the upper surface of the protective film 12. The groove 15b has a ring pattern turning around the opening 15a once, as viewed along the substrate normal direction.

Figure 2:
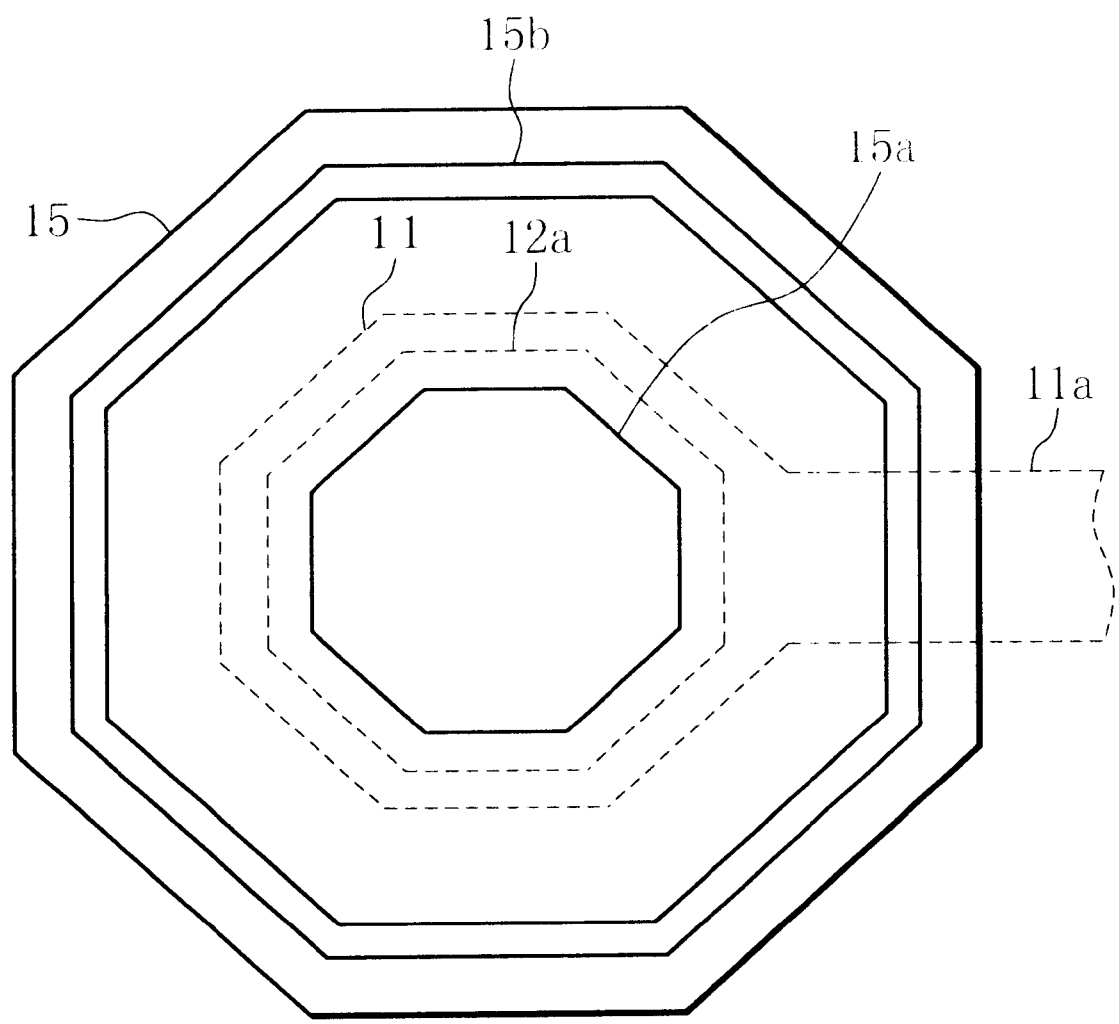
FIG. 2 is a plan view showing the structure near a bump of the semiconductor device of the first embodiment.

FIG. 2 is a plan view showing the structure near the electrode pad 11. The electrode pad 11 has, for example, a regular octagonal shape in plan, and is electrically continuous with a wiring 11a. The outer periphery of the insulating film 15 surrounds the electrode pad 11. The opening 12a is located inside the electrode pad 11, and the opening 15a is located inside the opening 12a. The openings 12a and 15a and insulating film 15 have also the regular octagonal shape in plan. The groove 15b is located slightly inside the outer periphery of the insulating film 15.

A distance between opposite sides of the regular octagon constituting the outer periphery of the opening 15a is 40 μm. A distance between opposite sides of the regular octagon constituting the outer periphery of the insulating film 15 is 100 μm. A distance between opposite sides of the regular octagon constituting the inner wall of the groove 15b is 86 μm, and the width of the groove 15b is 2 μm. Namely, the groove 15b is located inward by 5 μm from the outer periphery of the insulating film 15.

Reverting to FIG. 1, a barrier layer 19 covers an area from the inner surface of the opening 15a, the upper surface of the insulating film 15, the inner surface of the groove 15b, and to the upper surface of the insulating film 15 slightly inner than the outer periphery of the insulating film 15. The barrier layer 19 has a three-layer structure of a 500 nm thick Ti film 16, a 500 nm thick Cu film 17 and a 5 μm thick Ni film 18 stacked in this order from the substrate side.

A solder bump 20 is adhered to the barrier layer 19. The solder bump 20 is made of a SnAg alloy containing 2.6 wt. % Ag. The solder bump 20 covers not only the upper surface of the barrier layer 19 but also the side wall thereof.

Next, with reference to FIGS. 3A to 3E, a manufacture method for the semiconductor device shown in FIG. 1 will be described. Since the structure not upper than the interlayer insulating film 10 can be formed by known semiconductor processes, the manufacture method for the structure upper than the interlayer insulating film 10 will be described.

Figure 3A:
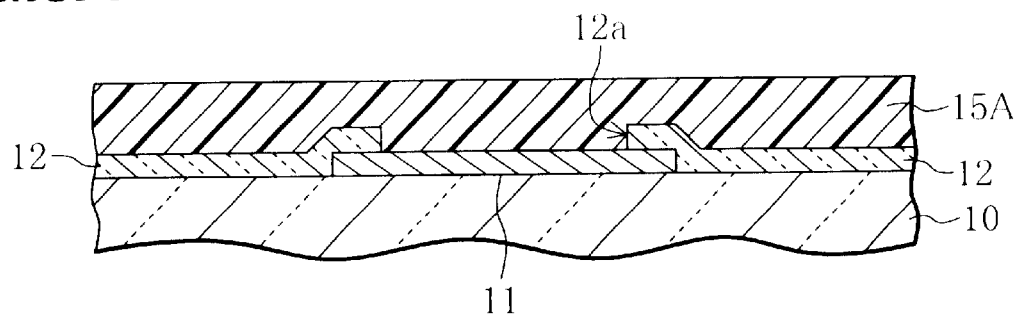
FIGS. 3A to 3E are cross sectional views of the semiconductor device of the first embodiment during manufacture processes.

The processes of forming the structure shown in FIG. 3A will be described. On the surface of the interlayer insulating film 10, a Cu film is deposited by sputtering. This Cu film is patterned to form an electrode pad 11. On the surfaces of the electrode pad 11 and interlayer insulating film 10, a silicon nitride film is deposited and a silicon oxide film is deposited on the silicon nitride film. The silicon nitride film and silicon oxide film are formed by chemical vapor deposition (CVD). An opening 12a is formed through the two layers, silicon nitride film and silicon oxide film, and a protective film 12 is left in the other area.

A photosensitive polyimide layer 15A is spin-coated on the surfaces of the protective film 12 and electrode pad 11, and pre-baked for 90 seconds to 2 minutes at 150° C. The polyimide layer 15A is controlled to have a thickness of 4 μm after an imidic process.

Figure 3B:
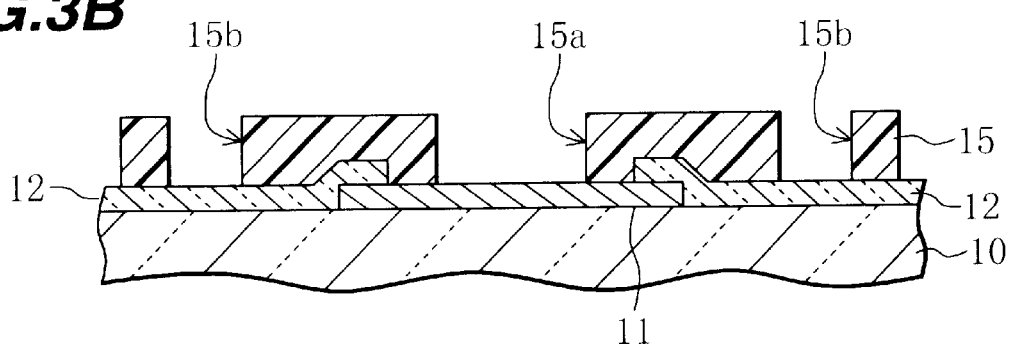

As shown in FIG. 3B, the polyimide layer 15A is selectively exposed and developed to remove an unnecessary polyimide layer 15A and form an opening 15a and a groove 15b. After the development, the polyimide layer 15A is cured for one hour at 370 to 380° C. An insulating film 15 made of polyimide and having a thickness of 4 μm can therefore be formed.

Figure 3C:
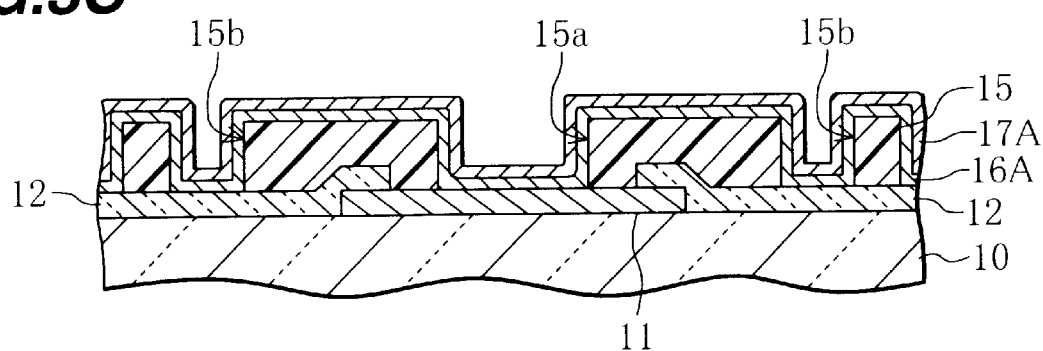

As shown in FIG. 3C, a 500 nm thick Ti film 16A and a 500 nm thick Cu film 17A are deposited on the surfaces of the insulating film 15, protective film 12 and electrode pad 11, by sputtering.

Figure 3D:
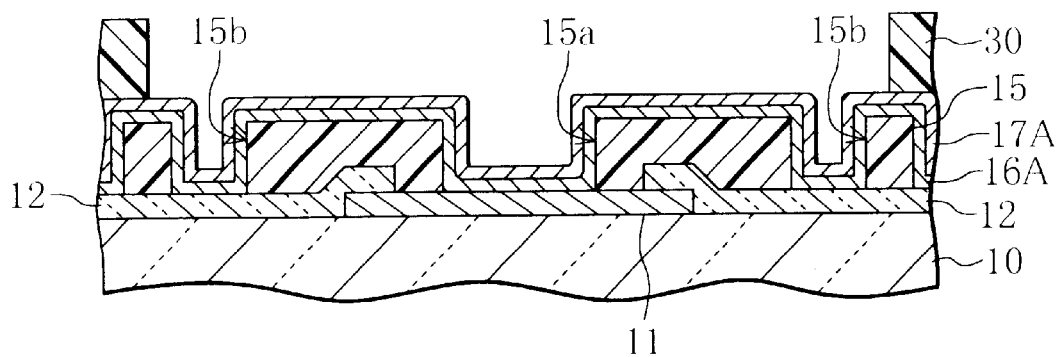

As shown in FIG. 3D, a resist pattern 30 is formed having an opening corresponding to an area where the barrier layer 19 shown in FIG. 1 is formed. The resist pattern 30 has a thickness of about 10 μm.

Figure 3E:
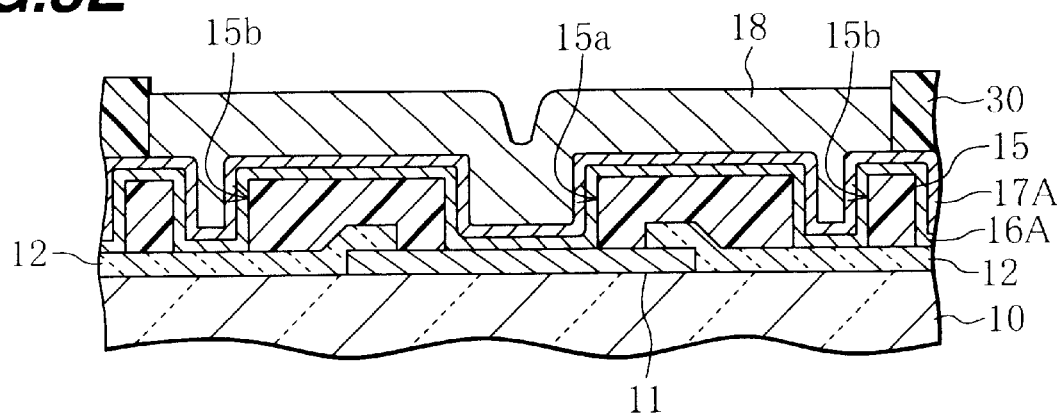

As shown in FIG. 3E, and Ni layer 18 is formed on the Cu layer 17A exposed in the opening of the resist pattern 30, to a thickness of 5 μm by electroplating. After the Ni layer 18 is formed, the resist pattern 30 is removed.

Thereafter, by using the Ni layer 18 as a mask, the Cu layer 17A and Ti layer 16A are etched. For etching the Cu layer 17A, mixed solution of hydrogen peroxide, acetic acid and water is used. For etching the Ti layer 16A, mixed solution of hydrofluoric acid and water is used. The barrier layer 19 shown in FIG. 1 can therefore be formed.

A solder ball is transferred to the barrier layer 19 by a transfer method. After the solder ball is transferred, the substrate is placed in a mixed gas atmosphere of nitrogen and hydrogen to perform a heat treatment at 270° C. The solder ball is reflowed so that the hemispheric bump electrode 20 shown in FIG. 1 is formed.

Figure 6:
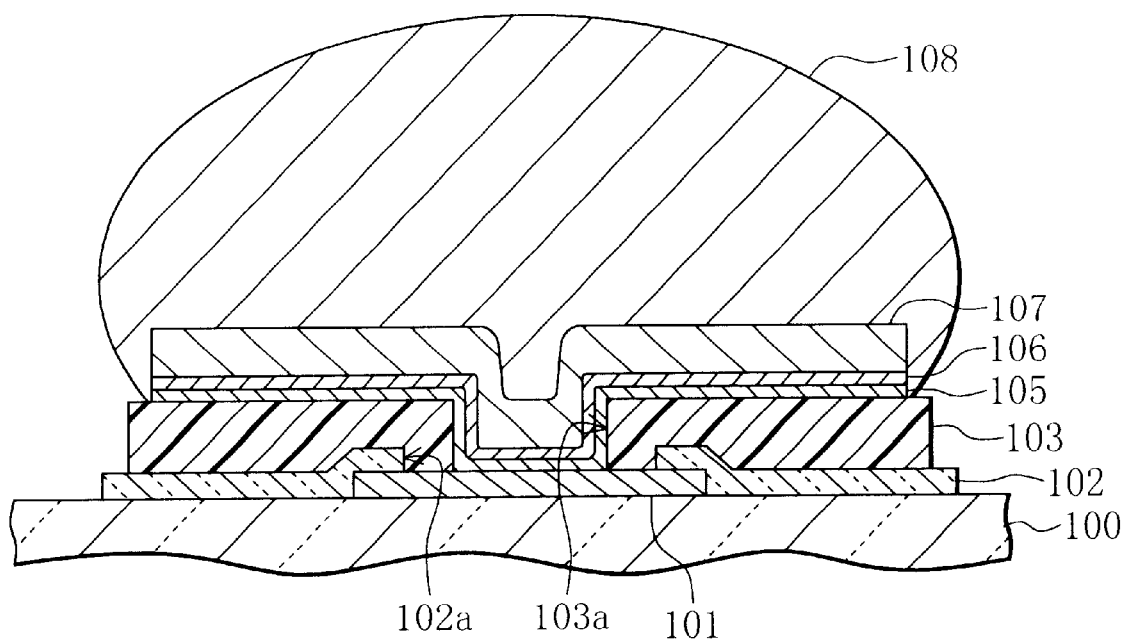
FIG. 6 is a cross sectional view showing the structure near a bump of a conventional semiconductor device.

Similar to the conventional example shown in FIG. 6, also in the first embodiment, Sn diffuses into the Cu layer 17 from the side wall of the Cu layer 17 during the reflow process. However, in the first embodiment, an intrusion depth of Sn is shallower than the conventional example shown in FIG. 6. This may be ascribed to a step formed by the groove 15b on the surface of the layer under the barrier layer 19.

The volume of the Cu layer 17 where the Sn intruded expands and the Cu layer 17 is peeled off from the side wall thereof. However, since the groove 15b functions as an obstacle, the peel-off of the Cu layer 17 stops at the position of the groove 15b and does not progress inside this position. Adhesion of the barrier layer 19 can therefore be retained sufficiently. In order to obtain such effects reliably, it is preferable to set the height of the step by the groove 15b greater than the thickness of the Cu layer 17. It is also preferable that the upper surface of the Cu layer 17 is conformal with the irregularity of the surface of the layer under the barrier layer 19.

The diffusion phenomenon of Sn into the Cu layer 17 also occurs when PbSn solder is used as the bump material. However, since the PbSn solder has an Sn content as small as about 5 wt. %, the problem caused by Sn diffusion does not become distinctive. As in the first embodiment described above, great advantages are expected when SnAg solder or the like having a large Sn content is used. Distinctive advantages are expected particularly when the Sn content is 50 wt. % or more.

The merits of the peel-off progress preventing effect by the groove 15b are lowered if the groove 15b shown in FIG. 2 is formed at the position remote from the outer periphery of the insulating film 15. It is preferable to form the groove 15b at the position satisfying the conditions of a≦2b and c≧2 μm, where a is a length from the center of the insulating film 15 to its outer periphery, b is a length from the center of the insulating film 15 to the outer wall of the groove 15b, and c is a length from the outer periphery of the insulating film 15 to the outer wall of the groove 15b.

Next, with reference to FIGS. 4A and 4B, modifications of the first embodiment will be described. In this first embodiment, the groove 15b has a ring pattern turning around the opening 15a once. In the modification shown in FIG. 4A, two grooves 15b are used. Each of the two grooves 15b has a ring pattern turning around the opening 15a once. For example, a width of each groove is 2 μm, and a distance between the two grooves is 2 μm. A distance between opposite sides of a regular octagon constituting the inner wall of the inner groove is, for example, 78 μm. The number of grooves may be three or more.

Figure 4A:
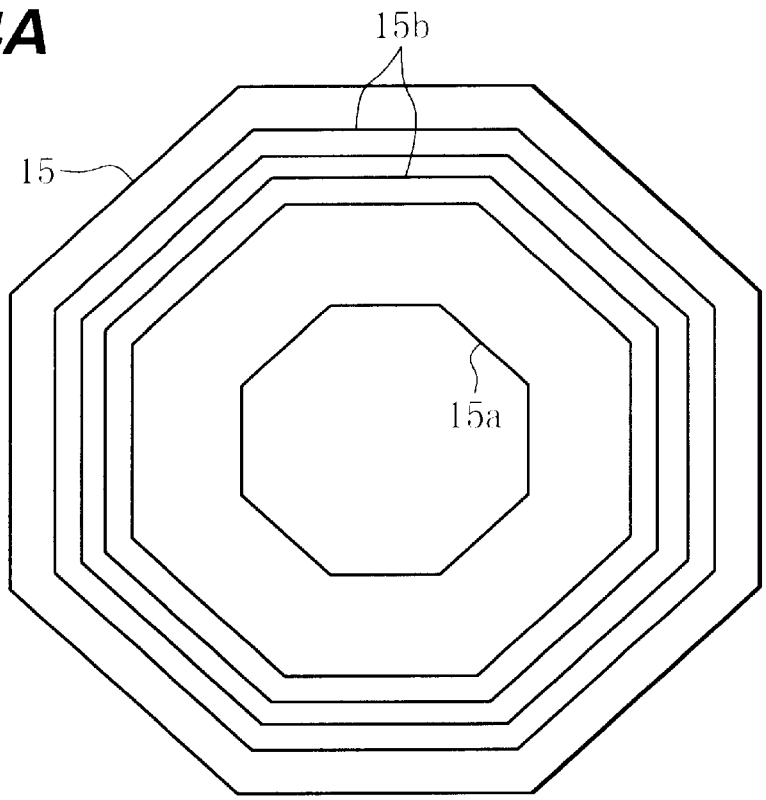
FIGS. 4A and 4B are plan views showing the structures near bumps according to modifications of the first embodiment.
Figure 4B:
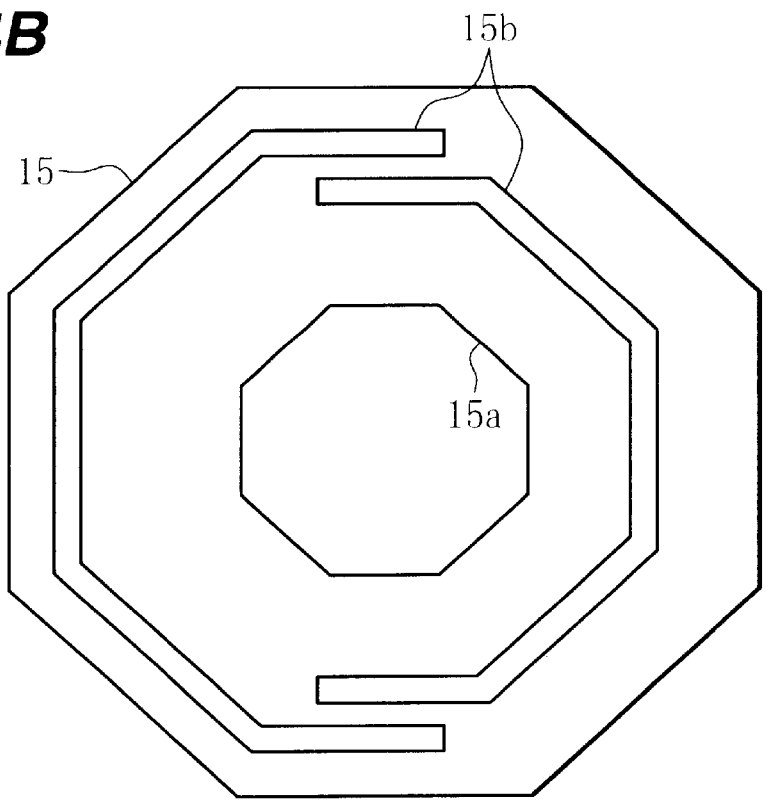

In the modification shown in FIG. 4B, each of two grooves 15b is not closed but has an open pattern. The two grooves are disposed in such a manner that if a half line is rotated once about one point in the opening 15a, the half line crosses at least one of the two grooves 15b at any position during one rotation. Namely, the two grooves are partially overlapped in the circumferential direction relative to the center of the opening 15a. For example, one groove is constituted of a portion of the inner groove of the two grooves shown in FIG. 4A, and the other groove is constituted of a portion of the outer groove. The number of grooves may be three or more.

Similar to the first embodiment, also in the modifications shown in FIGS. 4A and 4B, similar effects to the first embodiment can be expected. In the modification shown in FIG. 4A, two grooves are disposed in a radial direction relative to the center of the opening 15a. The diffusion depth of Sn into the Cu layer 17 is therefore expected shallower than that of the first embodiment.

FIG. 5 is a cross sectional view of a semiconductor device according to a second embodiment of the invention. In the second embodiment, in place of the groove 15b of the semiconductor device of the first embodiment shown in FIG. 1, a projection 22 of a ring shape turning around an opening 15a once is formed on the surface of an insulating film 15. The height of the projection is 4 ì m which is approximately equal to the thickness of the insulating film 15. The other structures are similar to those of the first embodiment.

A method of forming the projection 22 will be described. In the process shown in FIG. 3B of the manufacture method for a semiconductor device of the first embodiment, the insulating film 15 of polyimide is left in the region where the groove 15b is left unetched. After the insulating film 15 is subjected to an imidic process, a second polyimide layer is formed by spin coating. This second polyimide layer is exposed and developed to leave the projection 22. The processes after the projection 22 is formed are similar to those of the first embodiment.

Also in the semiconductor device of the second embodiment shown in FIG. 5, the projection 22 prevents a peel-off progress of the barrier layer 19. The plan shape of the projection may be a similar pattern to that of the groove 15b of each of the two modifications of the first embodiment respectively shown in FIGS. 4A and 4B.

In the semiconductor device of the first embodiment, the step is formed by the groove 15b on the surface of the layer under the barrier layer 19. In the semiconductor device of the second embodiment, the step is formed by the projection. In this manner, since the step is formed on the surface of the layer under the barrier layer 19, Sn diffusion can be suppressed and peel-off of the barrier layer 19 can be prevented.

In the second embodiment as well as in the first embodiment, the opening 15a is located inside the opening 12a. Therefore, near the edge of the opening 12a, the barrier layer 19 is not directly in contact with the protective film 12. Furthermore, in the second embodiment, the groove 15b in first embodiment shown in FIG. 1 is not formed. Therefore, also near the outer circumference of the insulating film 15 of polyimide, the barrier layer 19 is not directly in contact with the protective film 12. Namely, the barrier layer 19 is not directly in contact with the protective film 12 anywhere.

When the bump electrode 20 made of SnAg solder solidifies, stress generates in the barrier layer 19. If the barrier layer 19 is directly in contact with the protective film 12, the stress causes cracks in the protective film 12. In the second embodiment, the cracks in the protective film 12 can be prevented from being generated because the insulating film 15 made of polyimide relieves the stress.

The present invention has been described in connection with the preferred embodiments. The invention is not limited only to the above embodiments. It is apparent that various modifications, improvements, combinations, and the like can be made by those skilled in the art.

What is claimed is:

1. A semiconductor device comprising:
    a conductive electrode pad formed on a partial area of an insulating surface;
    an insulating film covering said electrode pad, said insulating film having an opening exposing at least a partial upper surface of said electrode pad;
    a barrier layer of conductive material formed on the partial upper surface exposed on a bottom of said opening and on a surface of said insulating film near the opening; and
    a conductive bump adhered to said barrier layer,
    wherein a step is formed on a surface of a layer under said barrier layer between an outer periphery of said barrier layer and an outer periphery of the opening,
    wherein the step is formed by a groove surrounding the opening.

2. A semiconductor device according to claim 1, wherein said bump contains tin as its constituent element, and said barrier layer includes a Cu layer and a layer made of conductive material different from Cu formed on the Cu layer, and a height of the step is larger than thickness of the Cu layer.

3. A semiconductor device according to claim 2, wherein the groove or projection includes at least one closed pattern turning about the opening once, as viewed along a direction normal to the insulating surface.

4. A semiconductor device comprising:
    a conductive electrode pad formed on a partial area of an insulating surface;
    an insulating film covering said electrode pad, said insulating film having an opening exposing at least a partial upper surface of said electrode pad;
    a barrier layer of conductive material formed on the partial upper surface exposed on a bottom of said opening and on a surface of said insulating film near the opening; and
    a conductive bump adhered to said barrier layer,
    wherein a step is formed on a surface of a layer under said barrier layer between an outer periphery of said barrier layer and an outer periphery of the opening;
    wherein said bump contains tin as its constituent element, and said barrier layer includes a Cu layer and a layer made of conductive material different from Cu formed on the Cu layer, and a height of the step is larger than thickness of the Cu layer,
    wherein the groove or projection includes a plurality of elongated patterns as viewed along a direction normal to the insulating surface, and the groove or projection is disposed in such a manner that if a half line is rotated once about one point in the opening, the half line crosses at least one of the plurality of elongated patterns at any position during one rotation.

5. A semiconductor device according to claim 1, wherein said barrier layer includes a Cu layer and a layer made of conductive material different from Cu formed on the Cu layer, and said bump contains tin of 50 wt % or more as its constituent element.

6. A semiconductor device according to claim 5, wherein the conductive material different from Cu is Ni.

7. A semiconductor device comprising:
- a conductive electrode pad formed on a partial area of an insulating surface;
- an insulating film covering said electrode pad, said insulating film having an opening exposing at least a partial upper surface of said electrode pad;
- a barrier layer of conductive material formed on the partial upper surface exposed on a bottom of said opening and on a surface of said insulating film near the opening; and
- a conductive bump adhered to said barrier layer,
- wherein a step is formed on a surface of a layer under said barrier layer between an outer periphery of said barrier layer and an outer periphery of the opening,
- wherein the step is formed by a ridge surrounding the opening.

8. A semiconductor device according to claim 7, wherein said bump contains tin as its constituent element, and said barrier layer includes a Cu layer and a layer made of conductive material different from Cu formed on the Cu layer, and a height of the step is larger than thickness of the Cu layer.

9. A semiconductor device according to claim 7, wherein the ridge includes at least one closed pattern turning about the opening, once, as viewed along a direction normal to the insulating device.

10. A semiconductor device according to claims 7, wherein said barrier layer includes a Cu layer and a layer made of conductive material different from Cu formed on the Cu layer, and said bump contains tin of 50 wt % or more as its constituent element.

11. A semiconductor device according to claim 10, wherein the conductive material different from Cu is Ni.

12. A semiconductor device comprising:
- a conductive electrode pad formed on a partial area of an insulating surface;
- an insulating film covering said electrode pad, said insulating film having an opening exposing at least a partial upper surface of said electrode pad;
- a barrier layer of conductive material formed on the partial upper surface exposed on a bottom of said opening and on a surface of said insulating film near the opening; and
- a conductive bump adhered to said barrier layer,
- wherein a step is formed on a surface of a layer under said barrier layer between an outer periphery of said barrier layer and an outer periphery of the opening,
- wherein said bump contains tin as its constituent element, and said barrier layer includes a Cu layer and a layer made of conductive material different from Cu formed on the Cu layer, and a height of the step is larger than thickness of the Cu layer.

13. A semiconductor device according to claim 12, wherein the groove or projection includes at least one closed pattern turning about the opening once, as viewed along a direction normal to the insulating device.

* * * * *